United States Patent [19]
Fukuda et al.

[11] Patent Number: 5,348,837
[45] Date of Patent: Sep. 20, 1994

[54] PROJECTION EXPOSURE APPARATUS AND PATTERN FORMING METHOD FOR USE THEREWITH

[75] Inventors: Hiroshi Fukuda, Kodaira; Ryoko Yamanaka, Kokubunji; Tsutomu Tawa, Katsuta; Tsuneo Terasawa, Ome; Seiji Yonezawa, Hachioji, all of Japan

[73] Assignee: Hitachi, Ltd., Tokyo, Japan

[21] Appl. No.: 12,479

[22] Filed: Feb. 2, 1993

Related U.S. Application Data

[63] Continuation-in-part of Ser. No. 765,060, Sep. 24, 1991.

[30] Foreign Application Priority Data

Feb. 3, 1992 [JP] Japan .................................. 4-017454
Mar. 11, 1992 [JP] Japan .................................. 4-052750

[51] Int. Cl.$^5$ ................................................. G03C 5/00
[52] U.S. Cl. .................................... 430/269; 430/322; 355/53; 355/67
[58] Field of Search ........................ 430/5, 269, 322; 355/53, 67, 71

[56] References Cited

U.S. PATENT DOCUMENTS 5,208,629  5/1993  Matsuo et al. .................... 355/53

FOREIGN PATENT DOCUMENTS 56-12615  2/1981  Japan .

OTHER PUBLICATIONS

IEEE Transactions on Electron Devices, vol. ED-29, pp. 1828–1836.
Digest of Papers, 1991 4th Microprocess Conference, pp. 70–71.
Journal of Vacuum Science and Technology, vol. B9, No. 6, pp. 3113–3116.
Extended Abstracts of the 52nd Autumn Meeting, 1991, of the Japan Society of Applied Physics, No. 2.

Primary Examiner—Steve Rosasco
Attorney, Agent, or Firm—Fay, Sharpe, Beall, Fagan, Minnich & McKee

[57] ABSTRACT

A projection exposure apparatus has an effective source, a mask, a projection lens and an optical filter. The mask is illuminated with the light from the effective source having a substantially annular illumination distribution. The optical filter is disposed in the approximate position of the pupil plane of the projection lens. On the pupil plane, the transmittance of a first region is made lower than that of a second region, the first region being inside of the periphery of an annular region substantially conjugate with the effective source having the annular illumination distribution, the second region being outside of the periphery. Built in this manner, the apparatus forms fine patterns whose unit size is at least as small as the wavelength of the light used while maintaining high values of contrast and deep levels of focal length.

15 Claims, 15 Drawing Sheets

MATERIAL
31:CONDUTOR

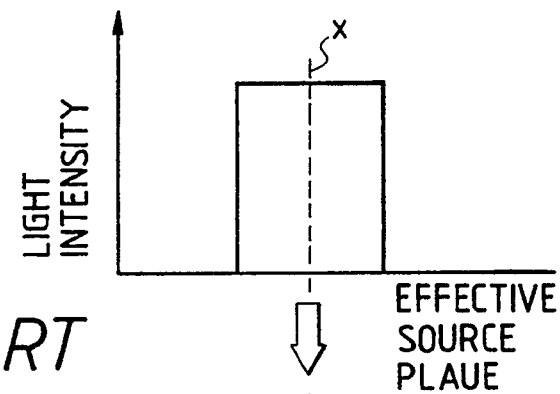
FIG. 2 (a) PRIOR ART
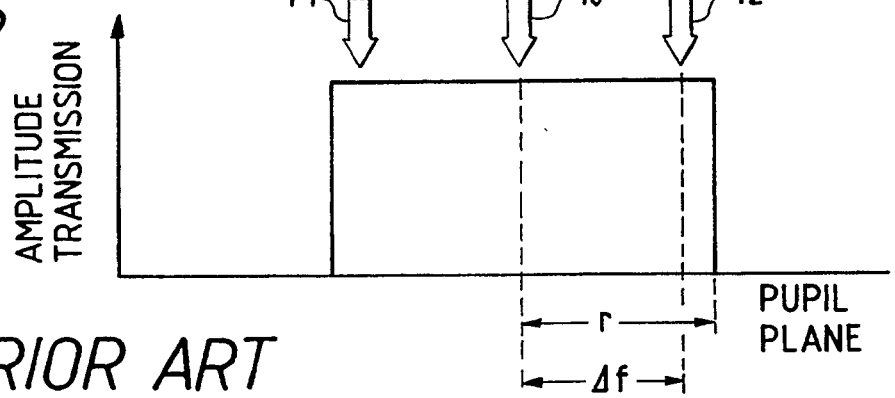
FIG. 2 (b) PRIOR ART

MATERIAL
31:CONDUTOR

PROJECTION EXPOSURE APPARATUS AND PATTERN FORMING METHOD FOR USE THEREWITH

The present invention is a continuation-in-part of copending application Ser. No. 07/765,060 filed Sep. 24, 1991, which is incorporated by reference herein in its entirety.

BACKGROUND OF THE INVENTION

The present invention relates to a projection exposure apparatus and a pattern forming method for use therewith. More particularly, the invention relates to a projection exposure apparatus capable of forming a fine pattern at a high level of contrast and to a profound depth of focus as well as to a pattern forming method for use with that apparatus.

Today, circuit patterns of solid state devices such as LSI's are getting ever finer in order to enhance the degree of their integration and the speed of their operation. The so-called step and repeat exposure method is generally used to form such fine patterns because of its capabilities to permit mass production and to ensure high levels of resolution. The resolution limit of that method is in direct proportion to exposure wavelength and in inverse proportion to the numerical aperture (NA) of the projection lens. Thus attempts have been made to shorten the exposure wavelength and to enlarge the numerical aperture for improved resolution limits. The depth of focus of the step and repeat exposure method is in direct proportion to exposure wavelength and in inverse proportion to numerical aperture squared. It follows that the depth of focus is getting considerably shallow even as the resolution limit is improving.

One conventional way proposed to enhance dramatically the resolution of the step and repeat exposure method is what is known as the phase-shifting method by which the phase of the light passing through an adjacent aperture on the mask is inverted. The phase-shifting method is discussed illustratively in "IEEE Trans. Electron Devices, Vol. ED-29, pp. 1828–1836 (1982)."

The so-called annular illumination method is a long-known method by which to improve the resolution of microscopes and like apparatuses. An application of the annular illumination method to optical lithography is described illustratively in "Digest of Papers, 1991 4th Microprocess Conference, pp. 70–71 (1991)."

Another conventional way to change the imaging characteristics of optical systems is optical filtering. This technique involves altering the phase-amplitude transmission distribution of the lens pupil. How the optical filtering may be applied to optical lithography is discussed illustratively in "Journal of Vacuum Science and Technology, Vol. B9, No. 6 (1991)."

In addition, Japanese Patent Laid-Open No. SHO/56-12615 proposes a combination of the annular illumination method with the optical filtering for attaining higher levels of resolution.

However, recent trends toward ever-higher integration of LSI's accompanied by the need for increasingly finer circuit patterns have reached a point where the unit circuit size is virtually equal to the wavelength of light. It has thus become difficult to enhance resolution by relying on the prior art attempts simply to enlarge numerical aperture or to shorten exposure wavelength.

Moreover, a recent development involves making the electronic device structure three-dimensional for such representative LSI's as DRAM's. This means the LSI substrate surface on which to project a mask pattern is often left out of the shallow depth of focus. As a result, forming a fine pattern over the entire LSI chip surface is getting increasingly difficult.

Nevertheless, the high productivity of the step and repeat exposure method, combined with its high reliability based on many years of technical accumulation, compels one to expect that the method will continue to be applied to areas where the unit circuit size drops below the wavelength of light. This requires ensuring a high level of resolution in conjunction with a sufficient depth of focus.

The above-mentioned phase-shifting method when employed enhances appreciably the resolution of periodic patterns such as LSI wiring patterns. Where the spatial coherency of illumination light is raised, the depth of focus is significantly improved as a consequence. But there are some disadvantages involved. For example, suitable phase distribution can be difficult depending on the pattern shape. Another disadvantage is that the proximity effect of complex patterns makes it impossible to acquire transfer patterns that precisely reflect the mask pattern. A further disadvantage is that the phase-shifting method is not effective enough when it comes to dealing with isolated patterns such as hole patterns.

The annular illumination method when utilized enhances the resolution limit of periodic patterns but degrades the overall image contrast. In addition, the annular illumination method is not as effective as the phase-shifting method in terms of improving resolution.

The use of optical filtering deepens the depth of focus and improves the resolution limit where isolated patterns are to be formed. However, the optical filtering is not effective enough where periodic patterns are involved.

In the field of optical microscopes, there is proposed a combined use of the annular illumination method and the optical filtering for preventing the degradation of image contrast. However, it has never been clear what optimum conditions ought to be under which to apply the combination method to optical lithography. In particular, where patterns of diverse sizes are to be formed concurrently, the form of illumination and the filter shape need to be optimized in order to keep the contrast and light intensity uniform and to acquire a sufficiently profound depth of focus.

The combination of the annular illumination method with the optical filtering for application to optical lithography is discussed illustratively in "Extended Abstracts of the 52nd Autumn Meeting, 1991" of The Japan Society of Applied Physics (No. 2, p. 602). The combined use of the two techniques as discussed in the above reference requires that the form of an effective source be shaped in such a manner that the conjugate region of that source on the pupil will be located on the most peripheral part of the pupil, and that the amplitude transmission of the light passing through the most peripheral part of the pupil be reduced to 50 percent. Although this method improves the resolution at the focused position, the shallow depth of focus causes even a slight amount of defocusing to disrupt the pattern resolution. Furthermore, because the light intensity of images depends on the density of the mask pattern, it is difficult to apply the combination method to actual LSI patterns. Since optical lithography requires, given patterns of diverse sizes, uniform contrast and light intensity as well as sufficient depth of focus, satisfactory results are difficult to attain by use of the annular illumination method and optical filtering in combination.

SUMMARY OF THE INVENTION

It is therefore an object of the present invention to overcome the above and other deficiencies and disadvantages of the prior art and to provide a novel projection exposure apparatus and a pattern forming method for use therewith, the apparatus being capable of maintaining high levels of contrast and deep levels of focal depth to form fine patterns whose unit size is equal to or smaller than the wavelength of light.

In carrying out the invention and according to one aspect thereof, there is provided a projection exposure apparatus comprising means for making the shape of an effective source annular in an illumination optics arrangement for mask illumination, and a conjugate pupil filter for making the transmittance smaller inside the periphery of the region conjugate with the annular region (i.e., region obtained by projecting the annular light spot onto the pupil plane) or in the conjugate region, than in the other regions on the pupil plane. The effective source is the exit plane of homogenizing optics such as the fly-eye lens for homogenizing the light emitted by such primary light sources as the mercury lamp and excimer laser. Generally, the effective source is in conjugate relation with the pupil plane of the projection lens. The shape of the effective source refers to the distribution pattern of light within the effective source plane.

In a preferred structure according to the invention, the annular region is such as to fulfill the relations $$0.6 \leq \sigma/r \leq 0.7$$

$$0.1 \leq w/r \leq 0.3$$

where, $\sigma$ is the radius of the center of the annular region on the pupil plane conjugate with the annular illumination region, $\omega$ is the annular region, and $\Gamma$ is the radius of the pupil.

In a further preferred structure according to the invention, predetermined regions (upper and lower regions, or left- and right-hand regions) of the annular illumination are removed or shielded depending on the direction of the mask pattern. Alternatively, predetermined regions of the annular illumination are removed or shielded in such a manner that one of an axially symmetrical pair of regions around the optical axis is illuminated and the other shielded. In either case, the transmittance of the region conjugate with the illuminated region is made smaller than that of the other regions.

How the invention works will now be outlined below in connection with an optimum combination of one-dimensional oblique incidence illumination which is symmetrical with respect to the optical axis and a conjugate pupil filter.

Suppose there exist an effective source having illumination distribution such as that shown in FIG. 1(A) on the effective source plane, and a pupil filter having an optical transmission distribution such as that shown in FIG. 1(B) on the pupil plane. FIG. 1(A) shows the illumination distribution of a typical effective source, and FIG. 1(B) indicates the amplitude transmission distribution of a typical pupil filter. This pupil filter is a conjugate filter that reduces to about 50 percent the transmittance of the region conjugate with the source region of FIG. 1(A) on the pupil plane. Where a line-and-space pattern is assumed to extend from the mask perpendicularly to the plane of the paper, the light is diffracted as indicated by solid and broken lines in FIG. 1. (In FIG. 1, a lens arrangement between light source and mask and another lens arrangement between mask and pupil are omitted.)

Of the light beams that pass through a mask 1, a 0-th order diffracted light beam 10 transmitted through the region in which the transmittance of the conjugate filter is lowered has its amplitude reduced by half. Positive and negative first-order diffracted light beams 11 and 12 distance themselves away from the 0-th order diffracted light beam 10 as the period of the line-and-space pattern gets smaller.

FIG. 1 shows a case in which the positive first-order diffracted light beam 12, after leaving a left-hand side light source, passes through the most peripheral part of the pupil. In this case, the negative first-order diffracted light beam 11 is left out of the pupil and cannot pass the pupil plane. The positive first-order diffracted light beam 12 passes through the pupil plane 100 percent without getting attenuated.

FIG. 2 shows, for comparison with FIG. 1, a case involving a prior art source and a circular pupil aperture combined with it. In either case, the amplitude of the projected image on a wafer is the sum of the biasing factor amplitude of the 0-th order diffracted light on the one hand, and the sinusoidal distribution amplitude of the first-order diffracted light on the other. In FIGS. 1 and 2, reference character x stands for the optical axis.

The pupil plane may be regarded as a spatial frequency domain. In that sense, the pattern period of the projected image is provided by the inverse number of the distance $\Delta f$ between positions through which a 0-th order diffracted light beam and a first-order diffracted light beam pass through the pupil plane. That is, the resolution limit R is given as $$R \geq \tfrac{1}{2}\Delta f$$

If the center coordinate of the illuminating region projected onto the pupil is represented by $\sigma$ and the radius of the pupil by $\Gamma$, then $$\Delta f \leq r + \sigma$$

according to the invention, as shown in FIG. 1. Therefore, $$R \geq \tfrac{1}{2}(r+\sigma)$$

By the prior art method, as indicated in FIG. 2, one gets $$\Delta f \leq r$$

thus $$R \geq \tfrac{1}{2}r$$

It follows that the resolution limit is improved by oblique incidence illumination. However, the prior art oblique incidence illumination setup generally dispenses with the pupil filter. This causes the negative first-order diffracted light to be shielded to let the image contrast deteriorate. According to the invention, the negative first-order diffracted light is shielded but the amplitude of the 0-th order diffracted light is attenuated by the conjugate pupil filter with respect to the amplitude of the positive first-order diffracted light. This provides high levels of contrast.

Below is a description of the optics behavior regarding defocusing with a view to obtaining the optimum value of $\sigma$. Generally, the defocus (z) dependence of the intensity distribution of the projected image for the periodic pattern is expressed as a function of two coordinates on the pupil plane: coordinate $r_0$ of the position through which the 0-th order diffracted light passes, and coordinate $r_1$ of the position through which the first-order diffracted light passes. The function is $$\exp[-ikz(r_0^2 - r_1^2)]$$

where, k is a constant and $r_0$ and $r_1$ are a predetermined pupil radius each. Thus the effect of defocusing is determined by $$|r_0^2 - r_1^2|$$

The radius $r_0$ remains constant because the 0-th order diffracted light always passes through the position conjugate with the light source on the pupil plane. On the other hand, if the period of the pattern varies, the first-order diffracted light moves over the pupil plane within the range of $$r_0 \leq r_1 \leq 1$$

The maximum value of $$|r_0^2 - r_1^2|$$

is at a minimum when $$r_0 = 0.7$$

That is, the position of the source for oblique incidence illumination is preferably such that $$r_0 = 0.7$$

in order to ensure a sufficient focal depth over a wide range of sizes. This setup provides a greater depth of focus than the arrangement where illumination is provided to irradiate the 0-th order diffracted light at the most peripheral part of the pupil in combination with a suitable conjugate filter.

What has been described is how one-dimensional oblique incidence illumination is illustratively implemented. In practice, the LSI pattern is typically arranged two-dimensionally on the mask. It follows that the practical setup should preferably utilize two-dimensional oblique incidence illumination in the form of annular illumination. Where one-dimensional oblique incidence illumination is used in combination with a conjugate filter, the contrast can degenerate with patterns such that the first-order diffracted light passes through the filter region symmetrically opposite to that through which the 0-th order diffracted light passes (i.e., $\Delta f = 2\sigma$). In such cases, as depicted in FIG. 3, the greater part of first-order diffracted light 13 is dislodged from an attenuating region 14. This ensures high levels of contrast over a wide range of sizes. The overlapping area between the positive and negative first-order diffracted light and the attenuating filter region may be minimized by suitably selecting the shape of the illumination source.

Although the optimum center position of annular illumination for minimizing the defocusing effect does not coincide precisely with that of oblique incidence illumination ($r_0 = 0.7$), the basic concept is the same. In practice, the radius r of the annularly illuminated center region is preferably about 0.6 to 0.7. The width of the annularly illuminated region is preferably greater in view of suppressing the two-dimensional proximity effect (or obtaining the fidelity of image with respect to the mask of the projected image of a complex mask pattern). However, an excessively wide annularly illuminated region diminishes depth of focus and resolution enhancing effect. In FIG. 3, reference numeral 15 represents a pupil aperture.

The attenuating region on the conjugate filter need not be precisely in conjugate relation with the annular illumination. Still, when the annular illumination is projected onto the pupil plane, the transmittance inside of the periphery of the annularly illuminated region should preferably be smaller than that outside thereof. According to the invention, it is important to emphasize the first-order diffracted light for higher contrast regarding the pattern near the resolution limit where the first-order diffracted light barely passes through the most peripheral part of the pupil.

The intensity of the 0-th order diffracted light passing through the pupil may be adjusted by partially shielding the region that is conjugate with the effective source instead of lowering the transmittance of that region. Where the conjugate pupil filter according to the invention is utilized, all 0-th order diffracted light after leaving its source is attenuated in amplitude and then passes through the pupil to interfere with the first-order diffracted light. If part of the 0-th order diffracted light passing through the pupil is shielded, the first-order diffracted light corresponding to the shielded 0-th order diffracted light portion loses the opportunity of interference with the 0-th order diffracted light. In this case, the first-order diffracted light gets into self-correlation and forms a bias component of uniform light intensity. Thus better results are obtained by employing the conjugate pupil filter.

These and other objects, features and advantages of the invention will become more apparent upon a reading of the following description and appended drawings.

BRIEF DESCRIPTION OF THE DRAWINGS

FIG. 2 is a set of views describing the operating principle of the prior art applicable to the invention;

DETAILED DESCRIPTION OF THE PREFERRED EMBODIMENTS

First Embodiment

Figure 1:
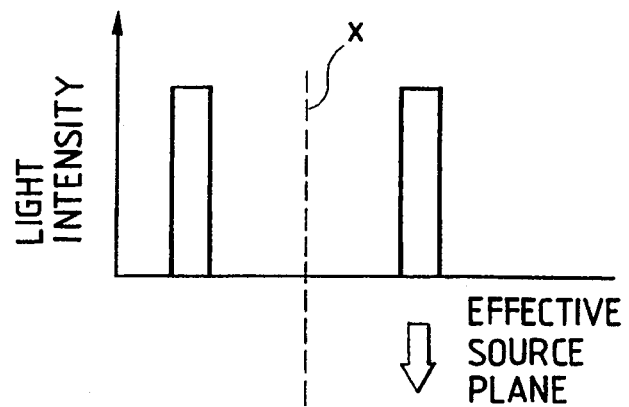
FIG. 1 is a set of views explaining the operating principle of the present invention.
Figure 1:
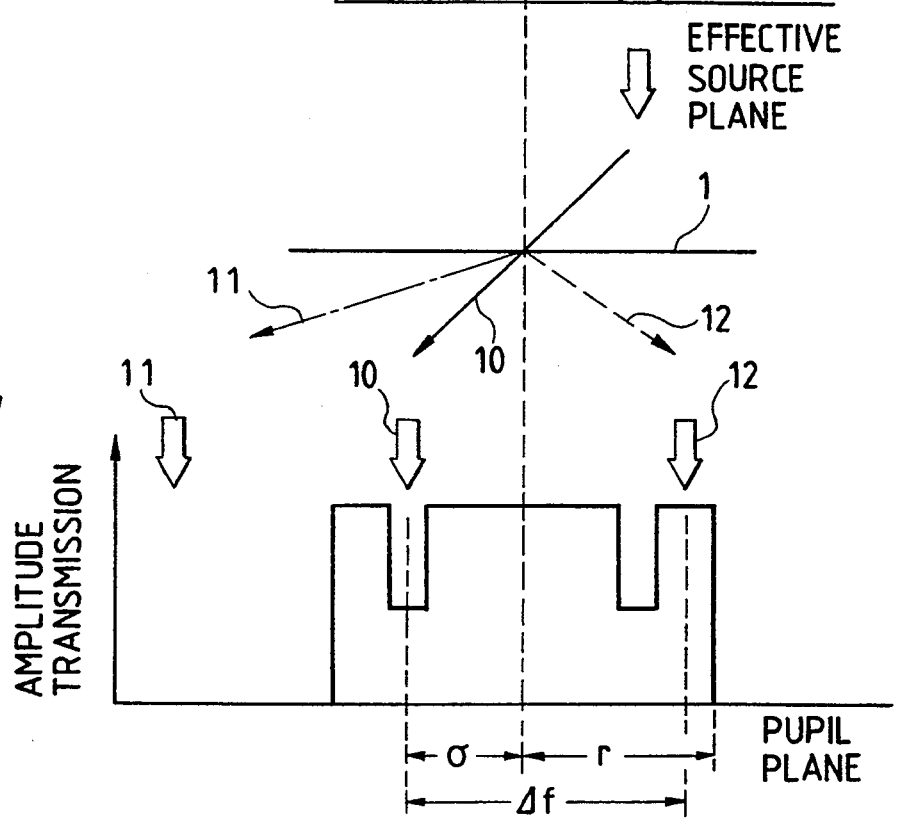
Figure 3:
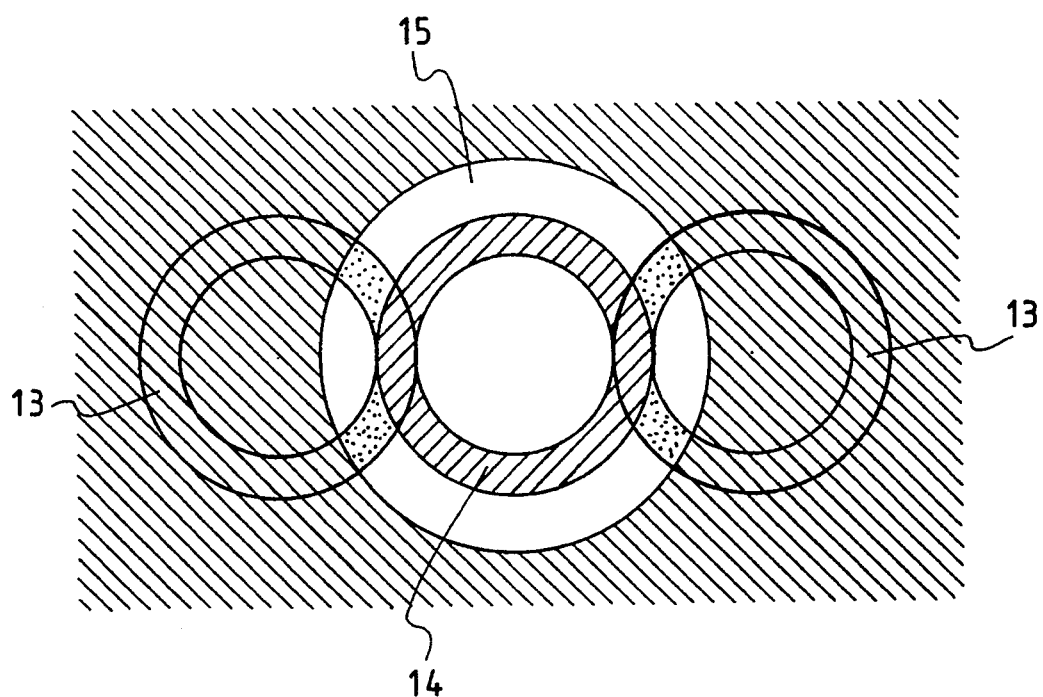
FIG. 3 is a view depicting the effect of the invention.
Figure 4:
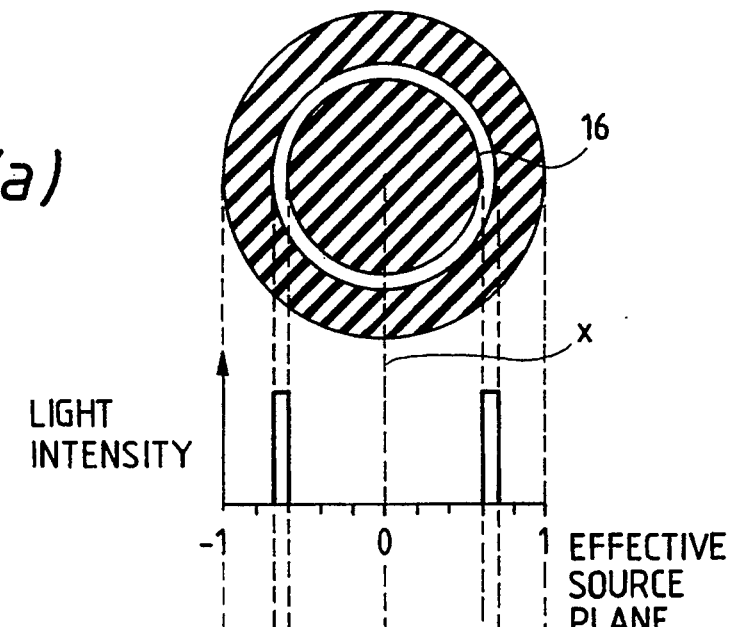
FIG. 4 is a set of views explaining an embodiment of the invention.
Figure 4:
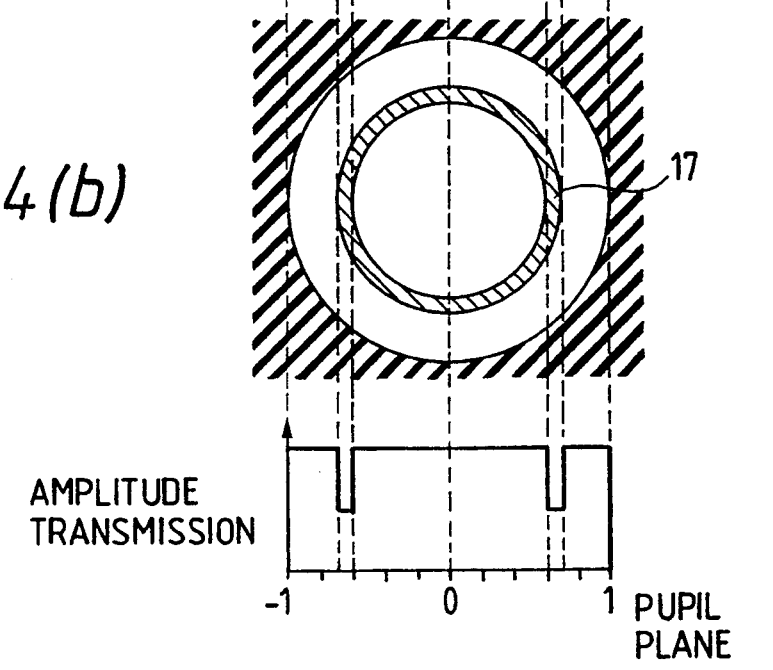

As a first embodiment of the invention, an annular aperture arrangement is inserted onto the effective source plane of the illumination optics in a KrF excimer laser step and repeat exposure apparatus having a projection lens with numerical aperture value of 0.5. The annular aperture is arranged so that the intensity distribution of the effective source becomes as shown in FIG. 4(A). In addition, an optical filter is inserted in the approximate pupil position of the projection lens so that the amplitude transmission distribution of the pupil is as shown in FIG. 4(B). It is also arranged that the radius $\sigma$ of the annular center region is 0.65 r, the width w of the annular region is 0.1 r, where r is the ratio of pupil and the amplitude transmission of the optical filter region conjugate with the annular region is 50 percent. In FIG. 4, reference numerals 16 and 17 represent a source region and a transmittance attenuating region, respectively.

Figure 5:
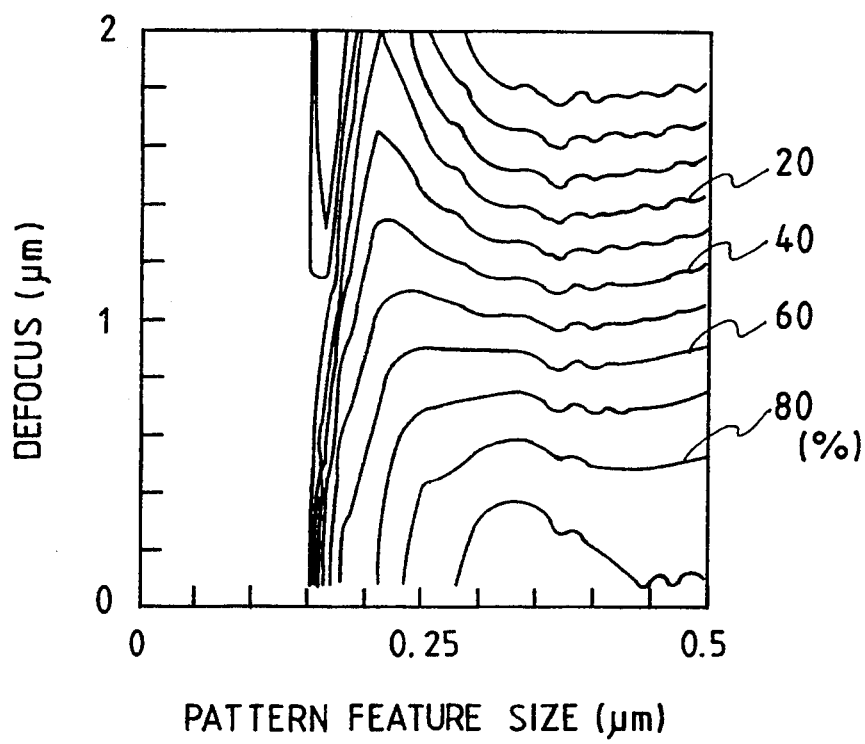
FIG. 5 is a view of contour lines representing the characteristics of the embodiment.
Figure 6:
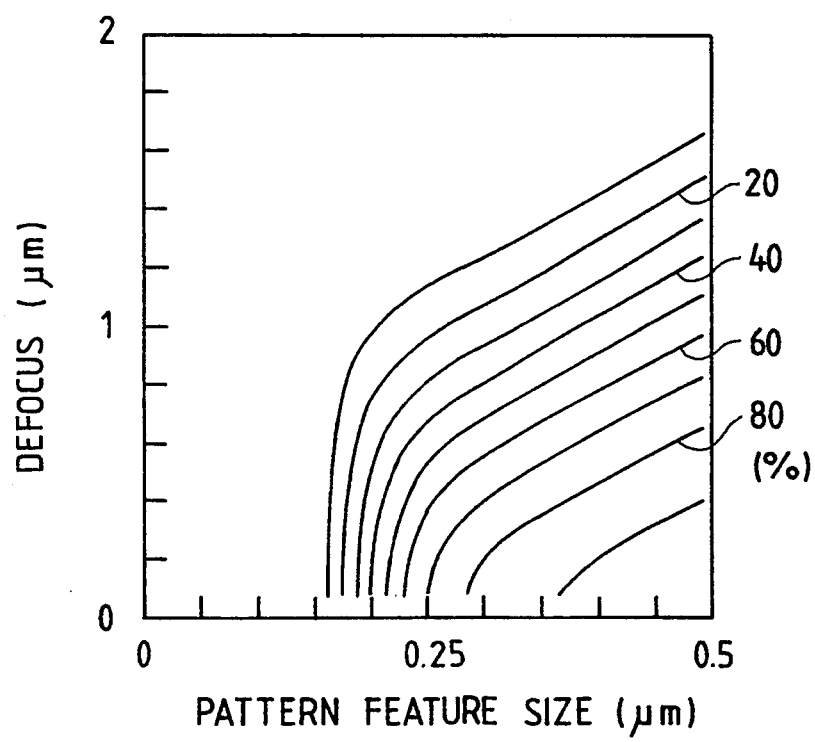
FIG. 6 is a view of contour lines representing the characteristics of the applicable prior art.

FIG. 5 shows by contour lines the pattern sizes and defocus dependence of the projected image contrast of line-and-space patterns in effect when the effective source and pupil filter of FIG. 4 are utilized. For comparison with FIG. 5, FIG. 6 depicts characteristics of a prior art setup similar to that of FIG. 5, the prior art setup involving a conventional circular source and a circular pupil aperture structure. Comparing the two figures reveals that the effective source and pupil filter embodying the invention provide higher resolution and greater focal depth than the prior art setup given patterns of the same sizes.

In the inventors' experiments, the above-described step and repeat exposure apparatus was used to transfer mask patterns of various sizes under diverse focusing conditions. A negative type chemically amplified resist having a sensitivity level of about 30 mJ/cm² was employed for the transfer. The result was the formation of 0.2 μm- apart line-and-space patterns having an excellent cross-sectional shape over a focal depth range of ±0.75 μm. By contrast, the comparable prior art exposure apparatus failed to form 0.2 μm-apart line-and-space patterns; it formed 0.3 μm-apart line-and-space patterns over a focal depth range of ±0.5 μm. That is, the invention when embodied as depicted above improves the resolution limit by about 50 percent while deepening the focal depth by a factor of about 1.5 at the same time. Although the insertion of the filter reduces the light intensity to about a third of the conventional level, it takes about 0.4 seconds to perform exposure. That means there is virtually no problem in practice.

The region of the annular illumination and the transmission distribution of the conjugate pupil filter are not limited to those of the first embodiment described above; they may alternatively be set otherwise within a range where the above-mentioned beneficial effects are ensured. Furthermore, alternative wavelengths, numerical aperture, resist process and mask pattern sizes may replace those of the first embodiment. Instead of the annular aperture arrangement for setting the intensity distribution of the effective source with the above-described first embodiment, other means including improved illumination optics may be used to obtain the necessary intensity distribution of the annular illumination.

Second Embodiment

A second embodiment of the invention is a variation of the first in which the annular region is defined to fall between w=0.5 r and W=0.8 r. The second embodiment provides about the same effects as the first embodiment. In particular, the second embodiment boosts the mask fidelity of the resist pattern following the transfer of a complex LSI pattern.

Third Embodiment

Figure 7:
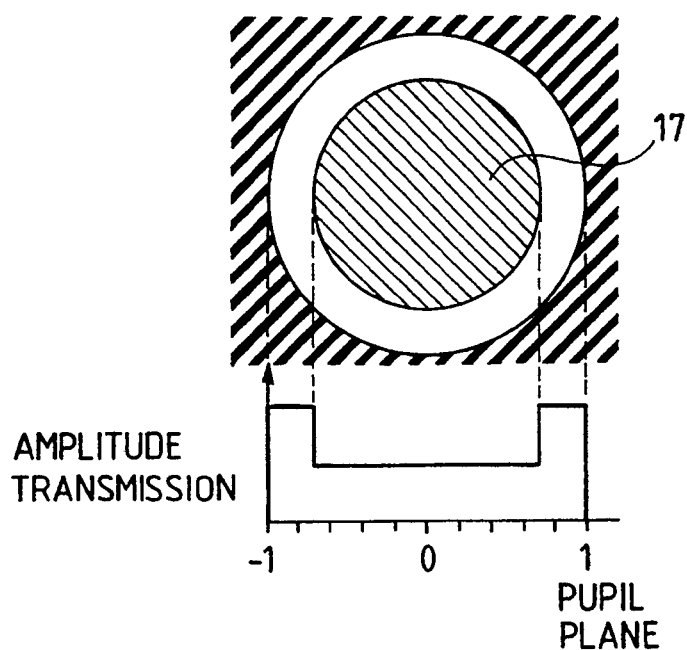
FIG. 7 is a view showing the amplitude transmission of a pupil filter used in another embodiment of the invention.

A third embodiment of the invention is another variation of the first embodiment, with the amplitude transmission of the pupil filter changed in such a manner as to exhibit the characteristics of FIG. 7. The third embodiment provides about the same effects as the first embodiment.

Fourth Embodiment

Figure 8:
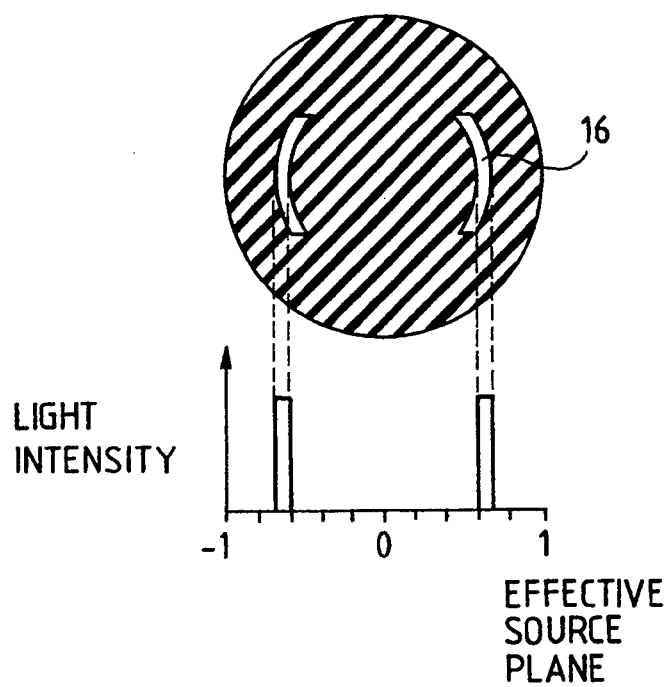
FIG. 8 is a view indicating the shape of apertures used in another embodiment of the invention.

A fourth embodiment of the invention is another variation of the first embodiment, with the shape of an aperture 16 changed on the effective source plane as illustrated in FIG. 8. In FIG. 8, an X-Y coordinate system (whose origin is the optical axis) is established as a normalized unit system in which the pupil radius is taken as 1 on the effective plane and on the pupil plane (on the effective source plane, the radius of the conjugate image of the pupil is used). In the fourth embodiment, the upper and lower parts of the annular region in the first embodiment are shielded. That is, the shielded range exists where $$y < -0.5,\ 0.5 < y$$

The fourth embodiment further enhances the contrast and deepens the focal depth for periodic patterns in the X direction. As a result, the resolution limit is improved to 0.18 μm, and the focal depth of 0.2 μm-apart line-and-space patterns is extended to ±1.5 μm. It should be noted that little change is observed in the imaging characteristics of periodic patterns in the Y direction. Where mask patterns are complex, an effect somewhat similar to the two-dimensional proximity effect is observed. For example, a defocus of ±0.75 μm causes a drop in the light intensity of isolated patterns. This makes it difficult to form an isolated resist pattern simultaneously with line-and-space patterns. This means that the fourth embodiment is most effective when applied to periodic patterns such as those of the memory arrays in memory LSI's, but may not be optimally suited for complex patterns of peripheral and other circuits. The effect specific to the fourth embodiment increases as the shielded area is widened.

Fifth Embodiment

Figure 9:
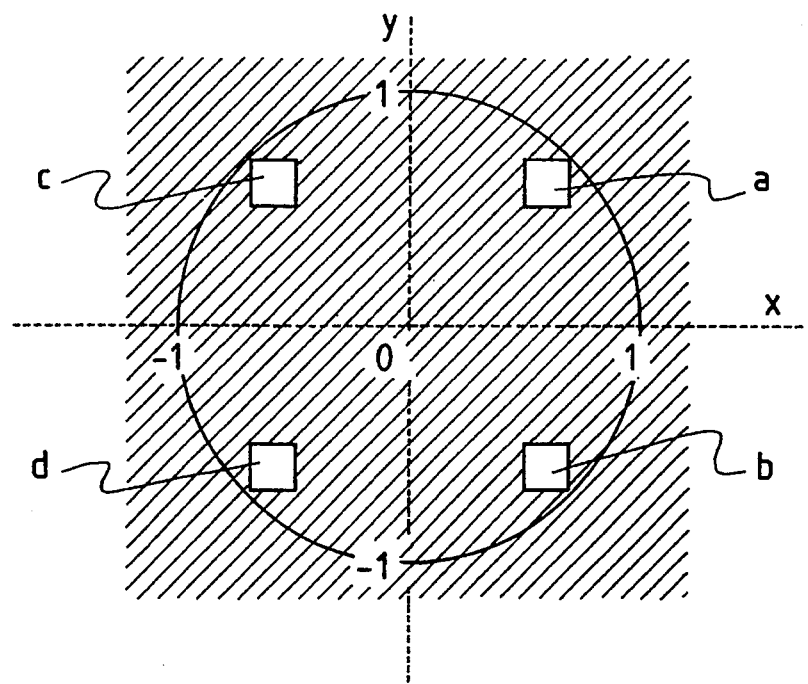
FIG. 9 is a view portraying effective sources used in another embodiment of the invention.

As a fifth embodiment of the invention, the same step and repeat exposure apparatus as that of the first embodiment incorporates an effective source and a conjugate pupil filter for use therewith as illustrated in FIG. 9. There are four illuminated regions a, b, c and d of the effective source:

a: $(0.5 < x < 0.7, 0.5 < y < 0.7)$
b: $(0.5 < x < 0.7, -0.7 < y < -0.5)$
c: $(-0.7 < x < -0.5, 0.5 < y < 0.7)$
d: $(-0.7 < x < -0.5, -0.7 < y < -0.5)$

On the effective source plane, an X-Y coordinate system is established as a normalized unit system in which the radius of the conjugate image of the pupil is taken as 1 and of which the optical axis is regarded as the origin. The pupil filter is arranged so that the amplitude transmission of its region conjugate with the effective source is at 50 percent.

Figure 10:
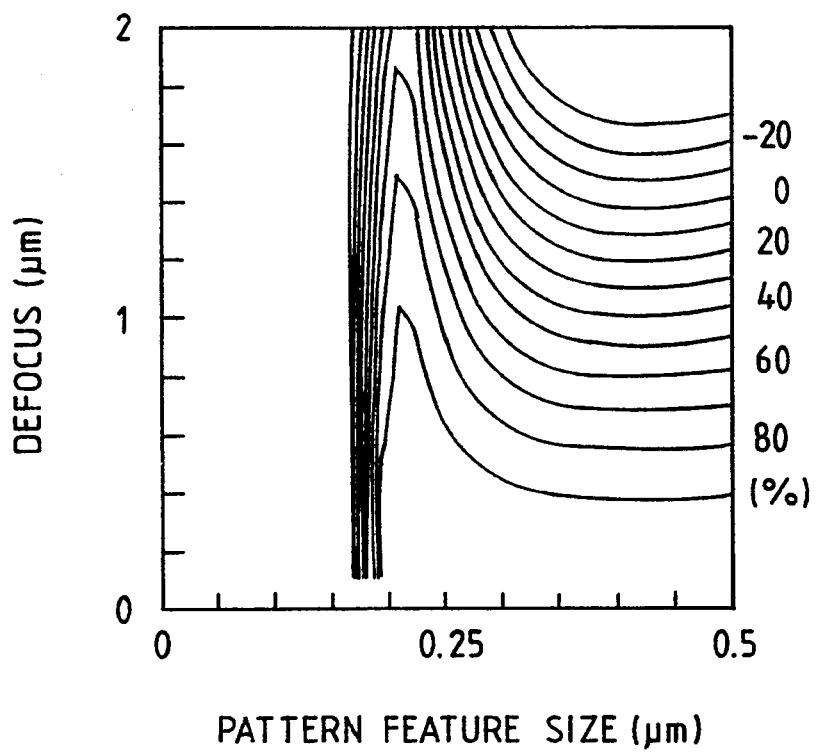
FIG. 10 is a view of contour lines indicating the effect of the embodiment of FIG. 9.

FIG. 10 illustrates by contour lines the pattern sizes and defocus dependence of the projected image contrast of line-and-space patterns in effect when the effective source and pupil filter of FIG. 9 are utilized. Comparing FIG. 10 with FIG. 6 (prior art example) reveals that the effective source and pupil filter constituting the fifth embodiment provide significantly higher resolution and much greater focal depth than the prior art setup.

In one of the inventors' experiments, the above-described step and repeat exposure apparatus was used, in the same manner as with the first embodiment, to transfer mask patterns of various sizes under diverse focusing conditions. The result was the successful formation of 0.2 μm-apart line-and-space patterns over a focal depth range of at least ±1.5 μm, with the periodic direction of the patterns made to coincide with the X and Y directions of FIG. 9. Because the fifth embodiment affords high levels of contrast for fine periodic patterns, it is possible to acquire a good resist pattern with its side substantially perpendicular. The fifth embodiment provides slightly lower levels of image quality with patterns other than the line-and-space pattern.

The region (shape) of the effective source and the transmission distribution of the pupil filter are not limited to those of the fifth embodiment described above; they may alternatively be set otherwise. Still, it is preferred that the effective source be located inside of circles with a radius of 0.2 each around four points ((x, y)=(±0.6, ±0.6)) In addition, alternative wavelengths, numerical aperture, resist process and mask pattern sizes of the exposure apparatus may be used instead of those for the fifth embodiment.

Without a pupil filter, the invention still provides higher resolution and greater focal depth than the prior art. Adding the pupil filter dramatically enhances the image contrast. That in turn improves the shape of the resist pattern.

Sixth Embodiment

Figure 11:
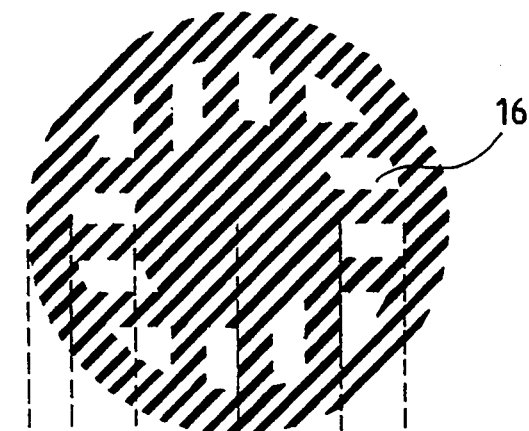
FIG. 11 is a set of views describing the characteristics of another embodiment of the invention.
Figure 11:
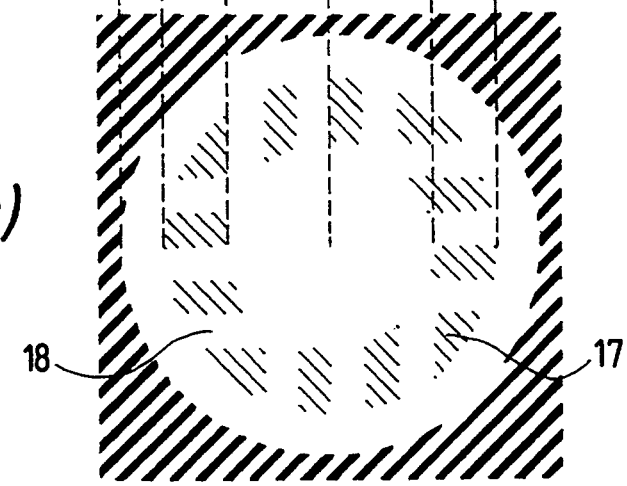

As a sixth embodiment of the invention, an effective source and a conjugate pupil filter are arranged as shown in FIGS. 11(A) and 11(B), respectively. In the figures, reference numeral 16 is the effective source; 17 is a transmission attenuating region; and 18 is a completely transmitting region. The sixth embodiment reduces the rate at which the positive and negative first-order diffracted light may pass through the transmission attenuating region of the conjugate pupil filter. This provides high levels of contrast.

Seventh Embodiment

Figure 12:
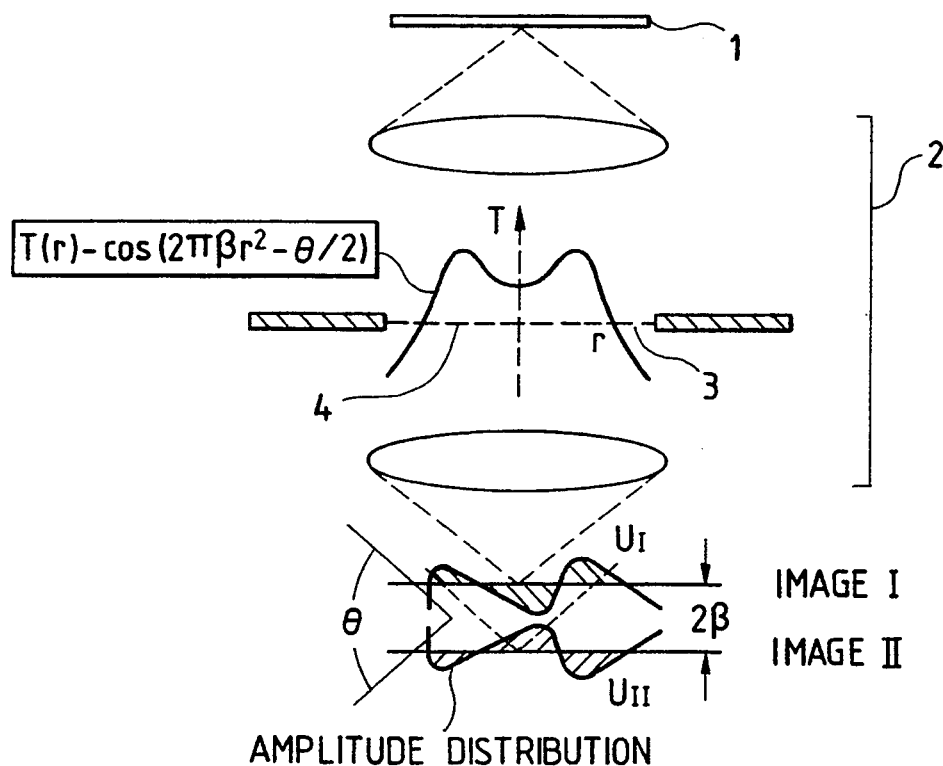
FIG. 12 is a view sketching another embodiment of the invention which uses a filter having a specific amplitude transmission distribution.

Some of the inventors of the present invention succeeded in making the focal depth of the above step and repeat exposure method greater and the resolution thereof higher by locating, in the pupil position of the projection lens, an optical filter having special complex amplitude transmission distribution. This novel method is proposed and discussed in "Extended Abstracts of the 38th Spring Meeting, 1991" of The Japan Society of Applied Physics (No. 2, p. 534). As depicted in FIG. 12, the method involves locating an optical filter 4 in the position of a pupil 3 (aperture stop position for determining the lens opening) of a projection lens 2 by which to project the pattern of a mask 1. The optical filter 4 has the complex amplitude transmission distribution defined approximately by a function $$T(r) = \cos(2\pi \cdot \beta \cdot r^2 - \theta/2) \times circ(r)$$

where, $\beta$ and $\theta$ are constants, and $\Gamma$ is a radius coordinate normalized with respect to the maximum radius of the pupil or lens opening. Practiced in the above setup, the method according to the invention provides an image that is a composite of two images (images I and II in FIG. 12) formed at different positions ±$\beta$ in the optical axis direction. The two images are put together in terms of amplitudes with a phase difference corresponding to the angle $\theta$. The resulting increase in the resolution limit allows deep focal depth and high image quality to be maintained despite ongoing attempts to pursue higher numerical aperture and smaller unit pattern sizes relative to the light wavelength.

Figure 13:
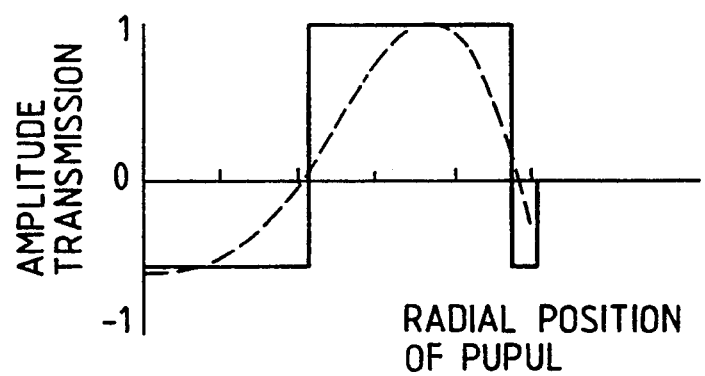
FIG. 13 is a view showing amplitude transmission distribution of a typical optical filter in connection with the invention.

FIG. 13 is a view showing the complex amplitude transmission distribution of a typical optical filter in connection with the invention. A broken line curve in FIG. 13 indicates a representative complex amplitude transmission distribution in effect when $\beta = 0.65$ and $\theta = 260$ degrees; solid lines represent an approximation using a discrete function. This distribution is optimally suited for fine hole patterns.

The lens pupil is conjugate with the effective source plane. This allows the intensity distribution of the effective source to be reproduced. The effective source is usually the exit plane of a fly-eye lens; the source is made of a set of pinpoint sources which are focused by the fly-eye lens and which have an acute peak intensity each. Thus light is focused in pinpoint fashion at the lens pupil, with the result that the light intensity is locally enhanced. When an optical filter composed of an optical absorber and having complex amplitude transmission distribution is inserted in the above-described lens pupil, there occurs a problem: because the optical filter absorbs light and thereby generates heat locally, the filter can suffer thermal damage.

Figure 14:
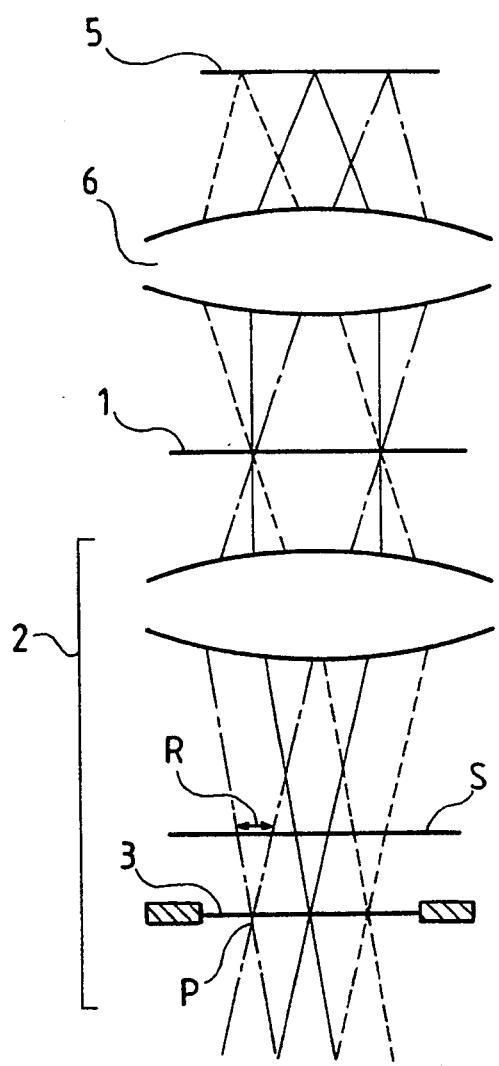
FIG. 14 is a set of views explaining how the invention works.
Figure 14:
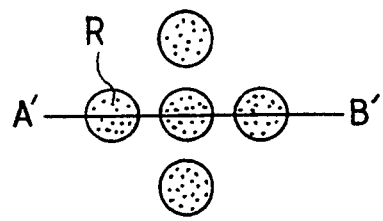
Figure 14:
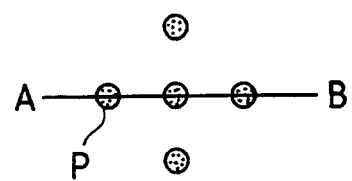
Figure 15:
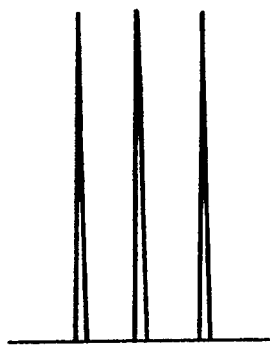
FIG. 15 is a set of views depicting typical intensity distribution of light spots in connection with the invention.
Figure 15:
Figure 15:
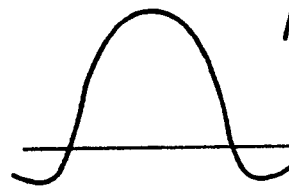
Figure 15:
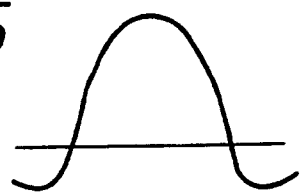

The problem is solved with the seventh embodiment in the manner described below. FIG. 14 is a set of views showing how this embodiment works. FIG. 14(A) is a schematic view depicting how the illumination optics of a typical projection exposure apparatus is related to the projection optics thereof. In FIG. 14(A), illustration is omitted from the image side away from the pupil position of the projection lens. Where no pattern is present on the mask 1 (i.e., where light does not diffract on the mask plane), the image of an effective source plane 5 is formed at the position of the lens pupil 3. FIG. 14(C) shows light spots of the effective source image occurring at the lens pupil 3 of FIG. 14(A), and FIG. 15(A) depicts the light intensity distribution taken on line A-B of FIG. 14(C). As illustrated, localized intensity peaks occur at points P of the lens pupil 3. In a position dislodged from the lens pupil in the optical axis direction, the defocusing effect causes an abrupt drop in the degree of light concentration. FIG. 14(B) illustrates light spots R of the effective source image on a surface S of FIG. 14(A) dislodged slightly from the lens pupil in the optical axis direction. FIG. 15(B) indicates the light intensity distribution taken on line A'-B' of FIG. 14(B). In this case, as illustrated, localized light intensity peaks disappear.

An image obtained on the pupil plane when a mask containing various patterns is placed at a predetermined field angle is in fact a composite image made of overlapping optical images having incident angles that vary with the position on the mask. The light having passed through pattern-free regions of the mask is focused in pinpoint fashion on the pupil (relative to the effective source). The light that passed through regions containing various patterns on the mask forms a Fraunhofer diffraction image corresponding to the various patterns on the pupil. Therefore the image acquired on the pupil from an ordinary mask is a composite image of the effective source image and the Fraunhofer diffraction image of diverse patterns. The general (i.e., macroscopic) form of the Fraunhofer diffraction image on the pupil in FIG. 15(C) is substantially the same as that on the surface S in FIG. 14(A), the surface being dislodged slightly in the optical axis direction as shown in FIG. 15(D). This tendency is more pronounced when the spatial coherency of the mask illumination light is lower. The Fraunhofer diffraction image is also focused on the lens pupil depending on the mask pattern, but the degree of focusing drops abruptly when the pupil surface moves even slightly away from the pupil plane in the optical axis direction.

In the manner described, on a surface slightly dislodged from the lens pupil in the optical axis direction, the focusing of light is suppressed even as the Fraunhofer diffraction image approximately the same as that of the lens pupil is obtained. Thus inserting the optical filter in the position slightly dislodged from the lens pupil in the optical axis direction serves two purposes: to avoid thermal damage caused by the pinpointed light on the lens pupil, and to provide effective filtering of the Fraunhofer diffraction image of various patterns on the mask.

The light beams that passed through out-of-axis positions on the mask enter the lens pupil obliquely. This means the principal light beams do not pass through the center of the optical filter on a surface slightly dislodged from the lens pupil in the optical axis direction.

As a result, the above-described approximate Fraunhofer diffraction image as a whole is displaced crosswise. That is, as the image height increases on the mask (i.e., with the pattern distanced increasingly from the optical axis), the effectiveness of the optical filter is decreased. With generally employed optical filters, image characteristics hardly change as long as the crosswise displacement amounts to no more than 10 percent of the pupil radius. The light beams that pass through the most peripheral part (on one side) of the pupil aperture pass through outside of the aperture radius on the dislodged surface. Given that characteristic, it is preferred, on the optical filter located away from the lens pupil, to make the radius of the transmitting region greater than that of the pupil aperture while maintaining the amplitude transmission of the most peripheral part of the filter.

How this seventh embodiment works may also be described from another point of view. That is, in FIG. 14, the light beams reaching the points P on the pupil 3 pass through the regions R of the surface S displaced from the pupil 3. When the optical filter is displaced away from the surface S, the filtering that should otherwise be done at the points P is performed in the regions R. Where the amount of such displacement is sufficiently low, the regions R are very small compared with the area of the pupil aperture. Because the amplitude transmission of the optical filter roughly changes in the radial direction generally (as shown in FIG. 13), the amplitude transmission of the regions R may be considered substantially the same as that of the points P. In that sense, even if the filter designed to be located on the pupil is displaced therefrom, the practical effect of the filter may be regarded as unchanged.

The optimum amount of displacement in the optical axis direction depends on the numerical aperture and radius of the pupil (aperture stop) of the lens arrangement in question. That lens arrangement is formed on the side of the mask 1 away from the pupils of a mask-illuminating condenser lens and a projection lens in effect when the lens pupil is regarded as the effective source image plane. For example, it is preferred that the amount of displacement between the principal light beams having passed through the most peripheral part of the mask exposure region and the optical filter center fall between 10 to 20 percent. Alternatively, the preferred amount of displacement is several to hundreds of times the focal depth of the Fraunhofer diffraction image on the pupil.

The projection lens arrangement is generally composed of numerous single lenses. Where the optical filter is displaced away from the lens pupil, that filter may be positioned outside the lenses that flank the pupil surface. In any case, the optical filter may be located anywhere as long as it is so positioned as to ensure the beneficial effects of the invention.

The present invention is also effective when applied to annular illumination optics. In this case, however, it is necessary to optimize the amplitude transmission distribution of the filter in accordance with the shape of the effective source.

Eighth Embodiment

Figure 16:
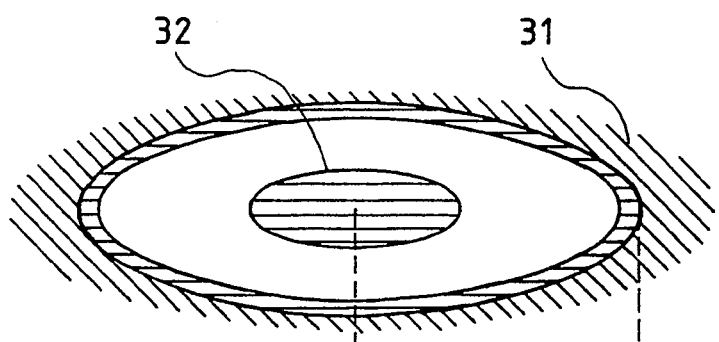
FIG. 16 is a set of views describing an optical filter used in another embodiment of the invention.
Figure 16:
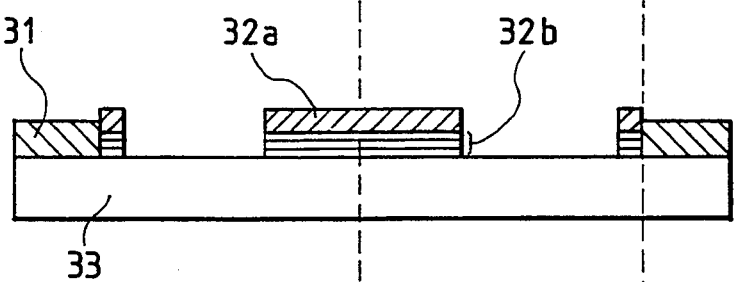
Figure 16:
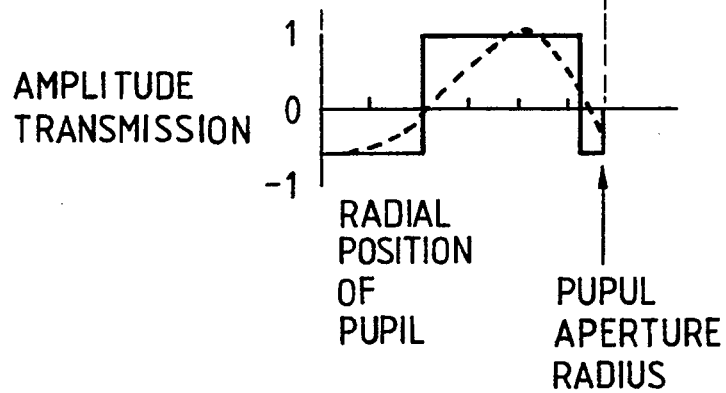

FIGS. 16(A) and 16(B) are a schematic perspective view and a cross-sectional view, respectively, of an optical filter constructed as part of an eighth embodiment of the invention. The filter surface is constituted by a pattern of a shielding film 31 with an opening and a composite film 32, the latter film being made of a phase shifter 32a and a partially transmitting film 32b provided for the opening. These components are formed on a transparent substrate 33 whose two surfaces are sufficiently parallel to each other.

FIG. 16(C) depicts by solid lines the complex amplitude transmission distribution of the optical filter. The broken-line curve in FIG. 16(C) represents the distribution in effect when $\beta=0.65$ and $\theta=260$ degrees in the foregoing expression of the amplitude transmission function T(r); this is a pattern of distribution optimally fit to form fine hole patterns.

The complex amplitude transmission distribution of the optical filter used in the eighth embodiment is a discrete approximation of the above optimum distribution. With the eighth embodiment, the phase shifter 32a and the partially transmitting film 32b are made from a silicon oxide film and a transparent chromium film, respectively. Alternatively, these films may be composed of other suitable materials in combination.

In the setup of the above embodiment, the optical filter is inserted in the vicinity of the projection lens pupil of a step and repeat exposure apparatus. The step and repeat exposure apparatus is a known type comprising a light source, illumination optics for having the light source illuminate a mask having a desired pattern, retaining means for retaining the mask in position, and a projection lens for projecting the mask pattern onto a substrate for exposure. For the step and repeat exposure apparatus used in the eighth embodiment, the numerical aperture (NA) of the projection lens is set for 0.5 and the exposure wavelength is that of i rays (365 nm).

Figure 17:
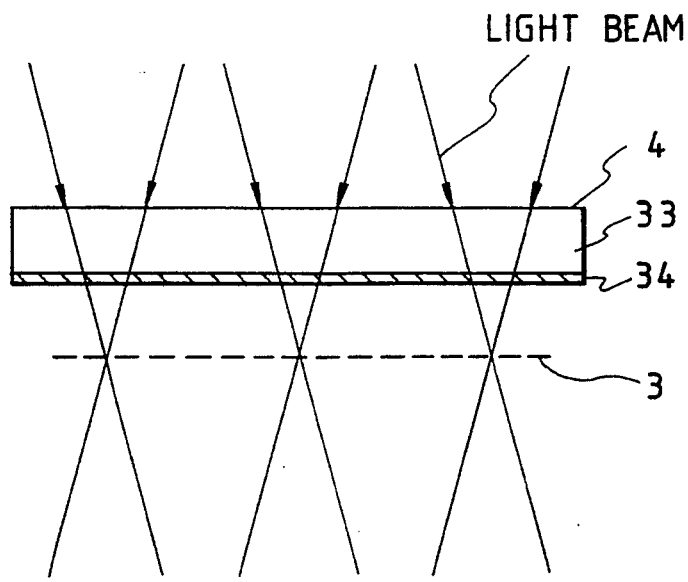
FIG. 17 is a view illustrating how the projection lens typically works in the proximity of the pupil in connection with the invention.

FIG. 17 is a schematic view of the vicinity of the projection lens pupil in the above setup. As illustrated, a filter surface 34 is displaced 5 mm away from the projection lens pupil 3 toward the mask. Because the amount of displacement is sufficiently small compared with the aperture radius of the pupil 3, the amplitude distribution in the radial direction does not differ appreciably from that on the pupil 3. Thus positioning the filter surface 34 where indicated in FIG. 17 still provides approximately the same result as when the filter surface 34 is located in the position of the pupil 3. The indicated filter position falls within the focal depth range of the effective optical image in the vicinity of the pupil. For this reason, the effective optical image inside the surface perpendicular to the optical axis in the displaced position differs in size from, but is the same in shape as, the effective optical image on the pupil surface; the two effective optical images do not overlap with each other. The peak light intensity of the effective optical image in the displaced position is 50 percent or less than that on the pupil surface. Since the transparent substrate 33 comes opposite to the lens pupil relative to the filter surface 34, the substrate 33 does not include the lens pupil.

The design of the entire lens arrangement of the invention is based on the concept of inserting the optical filter as described above. The filter surface 34 may be located on the wafer side with respect to the lens pupil 3. In this case, too, the transparent substrate 33 is preferably located opposite to the lens pupil 3 so that the substrate 33 will not contain the pupil 3. The amount of displacing the optical filter is not limited to what is described above. However, an otherwise determined amount of optical filter displacement should preferably involve readjusting or redesigning the lens arrangement.

In the inventors' experiments, the above-described optical filter was inserted where indicated. Then various mask patterns were exposed under diverse focusing conditions onto the resist-coated substrate. The exposed resist film was developed, and the obtained resist patterns were observed under a scanning electron microscope. It was found that hole patterns 0.25 μm in resist size were formed to a focal depth of ±2 μm.

On the other hand, when the optical filter was not inserted, the resolution limit was 0.35 μm and the focal depth was ±0.5 μm. This demonstrates significant benefits that can be obtained by use of the above optical filter.

In anther series of the inventors' experiments, exposure was continued with the optical filter inserted. The purpose of the experiments was to test the durability of the optical filter. It turned out that after more than 1,000 hours of accumulated exposure, the optical filter suffered no damage.

More about the workings of the embodiment will be described below. An optical filter, designed to constitute a fine pattern of transmitting and non-transmitting portions, may be composed of a transparent substrate and a non-transparent film, both made from relatively thick, heat-resistant materials. The optical filter of this construction is highly resistant to thermal damage.

The image formed immediately after the passage of light through the above-described optical filter has a discrete amplitude distribution wherein zero amplitude positions are scattered locally. However, this does not pose problems since the original spectrum (i.e., image obtained on the front surface of the optical filter) is sufficiently spread out where a spatially coherent local illumination device is employed.

Ninth Embodiment

Figure 18:
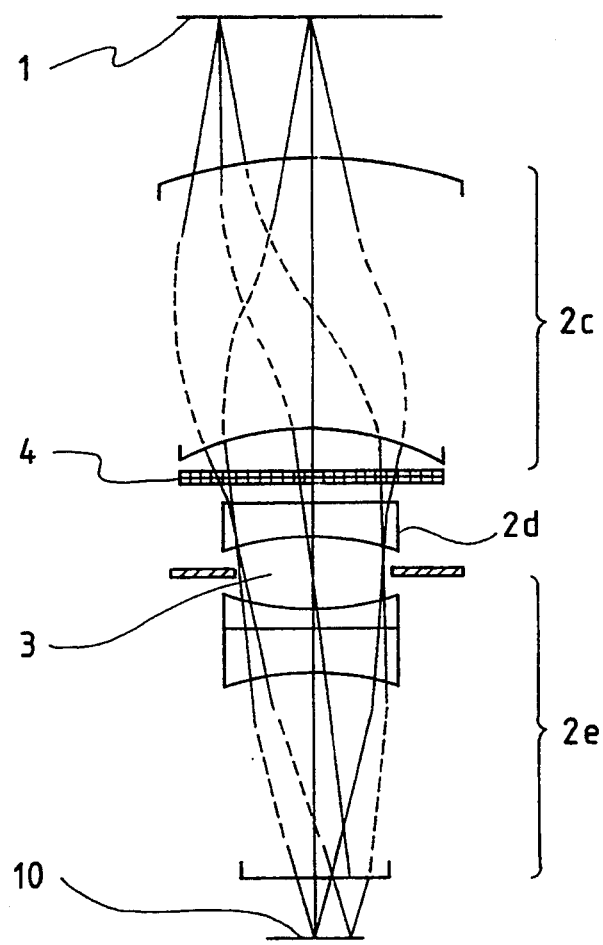
FIG. 18 is a view depicting another embodiment of the invention.

As shown in FIG. 18, the same optical filter used in the eighth embodiment is inserted in the vicinity of the projection lens pupil 3 in a step and repeat exposure apparatus. For this step and repeat exposure apparatus used in the ninth embodiment, the numerical aperture (NA) of the projection lenses 2c, 2d and 2e is set for 0.5 and the exposure wavelength is that of i rays (365 nm). The optical filter 4 is located opposite to the projection lens pupil 3 relative to the projection lens 2d nearest to the projection lens pupil 3. This setup also provides an optical image not much different from the image obtained at the projection lens pupil. The ninth embodiment has proved to afford the same effect as the eighth embodiment.

Tenth Embodiment

Figure 19A:
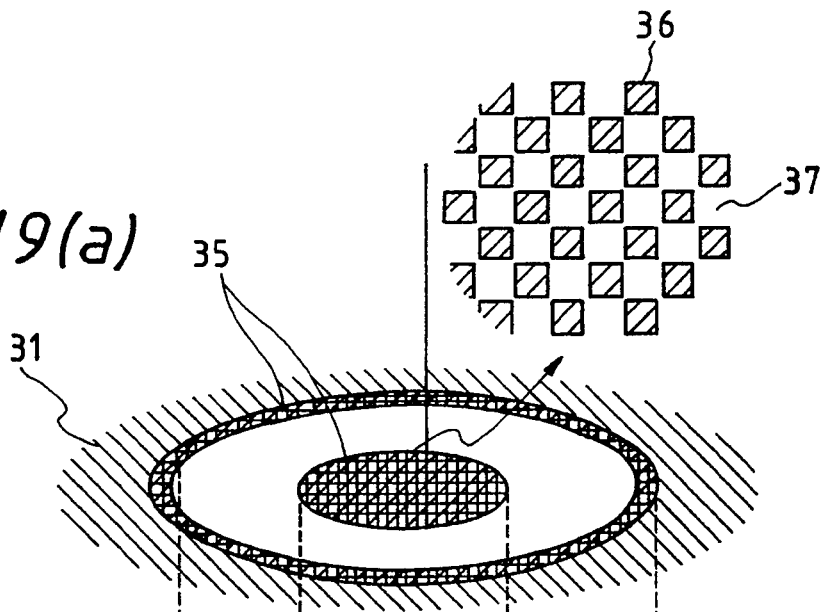
FIG. 19 is a set of views showing an optical filter used in another embodiment of the invention.
Figure 19B:
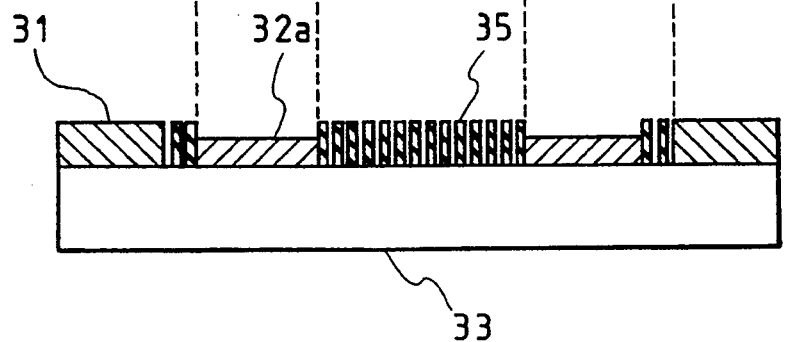
Figure 20A:
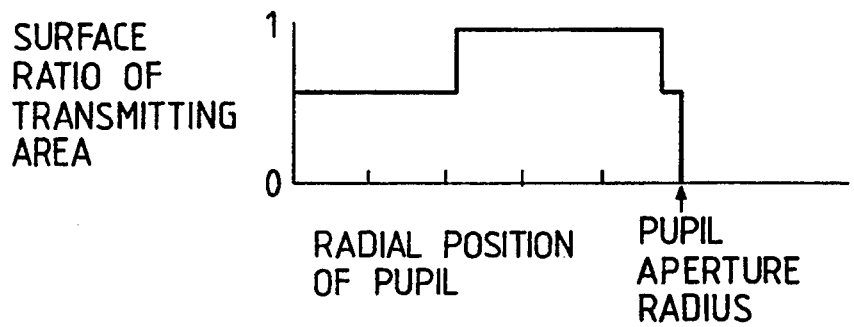
FIG. 20 is a set of views depicting the characteristics of the optical filter in FIG. 19.
Figure 20B:
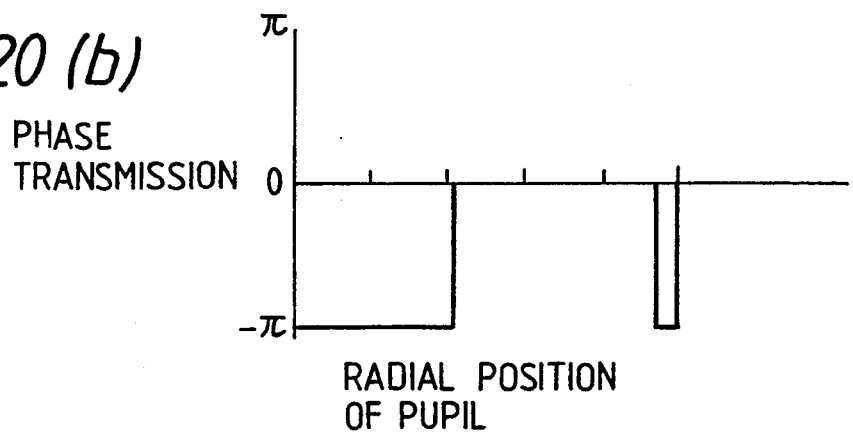

FIGS. 19(A) and 19(B) are a schematic perspective view and a cross-sectional view, respectively, of an optical filter constructed as part of a tenth embodiment of the invention. This optical filter is made of a transparent substrate 33 whose two surfaces are sufficiently in parallel and whose center has a round opening. The center and peripheral portions of the opening constitute a fine shielding pattern composed of transmitting parts 37 and non-transmitting parts 36. A top right sketch of FIG. 19(A) is a partially enlarged view of the fine shielding pattern 35. The non-transmitting parts 36 are made of a thick chromium film. The fine shielding pattern is sufficiently smaller in size than the radius of the optical filter (i.e., 1/10 or less of the radius). The ratio of the transmitting area to the non-transmitting area in a localized region of the optical filter is varied in the filter radius direction as shown in FIG. 20(A). The transmission distribution is equal to the absolute distribution of the amplitude transmission (represented by solid line in FIG. 13) of an optical filter having the conventional complex amplitude transmission distribution optimized for hole patterns. A phase shifter 32a made of SiO$_2$ film is provided on the transparent substrate 33 in regions other than those constituting the fine shielding pattern 35 in the opening. The phase transmission distribution of the optical filter is established as shown in FIG. 20(B). This distribution is the same as the phase transmission distribution of the prior art filter illustrated in FIG. 13.

In the inventors' experiments, the above optical filter was inserted in the approximate position of the pupil opening on the projection lens in an i ray step and repeat exposure apparatus (NA=0.5). In this setup, mask patterns containing hole patterns 0.5 μm (on wafer) in design size were projected under various focusing conditions onto a resist-coated substrate for exposure. Thereafter, the resist patterns were developed suitably and observed under a scanning electron microscope. It turned out that hole patterns 0.35 μm in resist size were formed to a focal depth of ±2 μm. On the other hand, with the optical filter not inserted, the resolution limit was found to be 0.45 μm and the focal depth ±0.5 μm.

After 1,000 hours of repeated exposure, the optical filter was taken out and checked for performance. The checks revealed no deterioration in the filter performance. Since the transparent substrate and the non-transmitting parts are sufficiently thick and have a heat-resisting property, the optical filter is highly resistant to the heat generation caused by light absorption.

The characteristics of the optical filter depicted in FIG. 19 are those optimized for hole patterns. Alternatively, the ratio of the transmitting area to the non-transmitting area in a localized region of the optical filter may be varied depending on the mask pattern type. In the latter case, with the prior art filtering method employed, the above area ratio is preferably such as to be substantially the same in absolute value as the amplitude transmission (or its discrete approximation) of the optical filter regarding a desired pattern. That amplitude transmission is expressed by a function of the radial coordinate r normalized with respect to the maximum pupil radius. The function is $$T(r) = \cos(2\pi \cdot \beta \cdot r^2 - \theta/2) \times \text{circ}(r)$$

where, $\beta$ and $\theta$ are a constant each. The phase transmission is preferably varied with the positive or negative sign of the amplitude transmission. The shape of the fine shielding pattern is not limited to the check-striped pattern of FIG. 18; it may be any one of diverse patterns such as concentric and radial patterns.

The material type of the phase shifter and the exposure wavelength and numerical aperture of the step and repeat exposure apparatus are not limited to those adopted by the tenth embodiment; other appropriate materials and settings may be utilized instead.

The fine shielding pattern need not be formed on the transparent substrate; it may be practiced as a stencil type shielding mask pattern. In that case, the absence of the transparent substrate in the lens arrangement leaves intact those basic optical characteristics of the projection lens which would otherwise be changed. That is, unlike the case where the optical filter is inserted, the lens design need not be changed. This, however, will require carrying out the difficult task of forming the phase shifter on the stencil.

As described, the tenth embodiment provides a highly durable optical filter with the use of various thin films that would require fine and precise film thickness control. It should be noted that with the tenth embodiment, the light beams not passing through the pupil are all absorbed by the optical filter. This necessarily results in heat generation on the filter surface. In that sense, the tenth embodiment is preferably used in combination with forced-cooling means implemented in another (i.e., eleventh) embodiment.

Eleventh Embodiment

Figure 21:
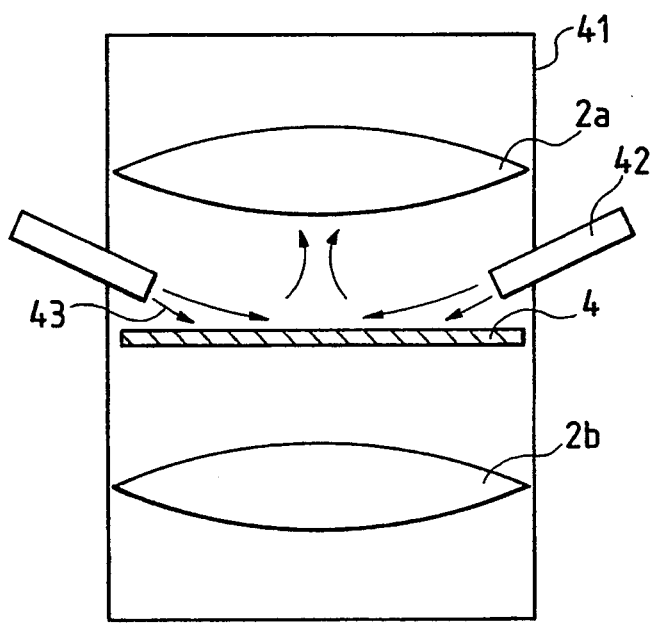
FIG. 21 is a partial schematic view of a typical projection exposure apparatus practiced in connection with the invention.

As an eleventh embodiment of the invention, forced-cooling means is provided in the projection lens arrangement of a projection exposure apparatus. In the lens arrangement, a conventional optical filter having a suitable complex amplitude transmission distribution is located in the approximate position of the projection lens pupil. As shown in FIG. 21, the optical filter 4 is positioned at the pupil of projection lenses 2a and 2b inside a lens barrel 41. A cooling gas nozzle 42 blows cooled helium gas 43, or causes it to flow, toward the surface of the optical filter 4. The gas removes the heat generated near the surface of the optical filter 4. If a plurality of cooling gas nozzles 42 are provided, the gas flows from the nozzles may be vibrated appropriately to eliminate any traps of cooling gas off the surface of the optical filter 4.

The cooling gas may be dry air, N$_2$ gas or any other appropriate gas. The forced-cooling means is not limited to the one employed in the eleventh embodiment; other appropriate means may be devised and implemented instead.

When the optical filter of the ninth embodiment was used in the projection exposure apparatus of the eleventh embodiment during the inventors' experiments, the same effect as with the eleventh embodiment was obtained.

Another aspect of the workings of the embodiment involves subjecting the optical filter to forced cooling against temperature rise. This provides more effective protection against the thermal damage of the optical filter.

Twelfth Embodiment

As a twelfth embodiment of the invention, a step and repeat exposure apparatus with the exposure wavelength of i rays (365 nm) is equipped with a mask of which the ratio of the transmitting area to the whole area is 30 percent or less. In this setup, a typical conventional optical filter is inserted in the position of the projection lens pupil.

With the optical filter inserted, exposure is performed only when masks of which the ratio of the transmitting area to the whole area is 30 percent or less are used. This significantly prolongs the service life of the optical filter. When exposure is carried out with the optical filter inserted only for exposure of contact hole patterns or through-hole patterns, the service life of the optical filter is further prolonged.

A further aspect of the workings of the embodiment need to be mentioned. When the ratio of the mask to the whole transmitting area is relatively high, there occur high peaks of light intensity in the effective source image obtained on the pupil surface or on the surface conjugate therewith. This can easily lead to thermal damage on the optical filter. If the optical filter occupies, say, 30 percent or less of the whole transmitting area, that filter is less likely to suffer thermal damage.

As described and according to the invention, fine patterns whose unit size is equal to or smaller than the wavelength of the light used are formed at high levels of contrast and with deep focal depths.

When the optical filter is displaced slightly from the projection lens pupil or from a position conjugate therewith in the optical axis direction, thermal damage to the optical filter is effectively prevented. In addition, filtering of the Fraunhofer diffraction image of mask patterns is effectively carried out.

One mode of carrying out the invention is a projection exposure apparatus with an optical filter positioned in the approximate position of the projection lens pupil or of a position conjugate therewith under the step and repeat exposure method. The ratio of the transmitting area to the non-transmitting area in a localized region of the optical filter is made approximately the same as the amplitude transmission distribution specific to that region, the surface of the optical filter constituting a fine pattern made of transmitting and non-transmitting parts. This projection exposure apparatus makes it possible to perform effective filtering of the Fraunhofer diffraction image of the mask pattern while avoiding the thermal damage that may otherwise occur on the projection lens pupil due to the light concentrated in pinpoint fashion.

Another projection exposure apparatus embodying the invention involves positioning at the projection lens pupil an optical filter having a suitable amplitude transmission distribution, the filter being cooled by forced-cooling means. This setup avoids the thermal damage that may otherwise occur on the projection lens pupil due to the light focused in pinpoint fashion.

In any of the above projection exposure apparatuses, an optical filter having an appropriate amplitude transmission distribution is positioned for insertion in the position of the projection lens pupil. In operation, the optical filter is inserted where required for exposure only during the use of a mask of which the ratio of the transmitting area to the whole area is below a predetermined value. This permits effective pattern formation while circumventing the thermal damage to the optical filter.

As described, the exposure apparatus and the pattern forming method for use therewith according to the invention maintain deep levels of focal depth and high values of image quality even as attempts are being made at higher numerical apertures and shorter wavelengths to obtain better resolution limits. Constituted as described, the apparatus has high durability as an additional benefit.

As many apparently different embodiments of this invention may be made without departing from the spirit and scope thereof, it is to be understood that the invention is not limited to the specific embodiments thereof except as defined in the appended claims.

What is claimed is:

1. A projection exposure apparatus comprising:
   a light source;
   shaping means for making the illumination distribution of light beams from said light source annular on the plane of an effective source relative to an optical axis;
   illumination optics for irradiating the light from the plane of said effective source onto a mask having a predetermined pattern;
   projection lens means for projecting said pattern onto a resist film; and
   transmittance reducing means for making the transmittance of a first region on the pupil plane of said projection lens means lower than that of a second region on the pupil plane of said projection lens means, said first region being inside of the outer periphery of an annular region substantially conjugate with said effective source, and said second region being outside of said outer periphery.

2. A projection exposure apparatus according to claim 1, wherein the transmittance of said annular region is lower than that of other regions on said pupil plane.

3. A projection exposure apparatus according to claim 1, wherein said transmittance reducing means includes an optical spatial filter having a transmission distribution such that the transmittance inside of said annular region substantially conjugate with said effective source is smaller than the transmittance outside thereof.

4. A projection exposure apparatus according to claim 3, wherein the transmittance inside of said annular region is 35 to 65 percent of the transmittance outside thereof.

5. A projection exposure apparatus according to claim 3, wherein said transmittance reducing means is displaced in the optical axis direction from any one of the pupil plane of said projection lens means and a surface conjugate with said pupil plane.

6. A projection exposure apparatus according to claim 5, wherein said transmittance reducing means reduces the peak light intensity of an effective source image on a surface perpendicular to said optical axis to at least 50 percent of the peak light intensity of another effective source image obtained on any one of said pupil plane and said surface conjugate with said pupil plane.

7. A projection exposure apparatus according to claim 5, wherein said optical spatial filter has transmitting and non-transmitting parts and a feature size that is smaller than 10 percent of the radius of said pupil plane, said optical spatial filter being disposed on any one of said pupil plane and said surface conjugate with said pupil plane, and wherein the area ratio of said transmitting parts in a localized region of said optical spatial filter is substantially the same in absolute value as a predetermined amplitude transmission distribution.

8. A projection exposure apparatus according to claim 1, wherein said annular region of said pupil plane is such as to fulfill the relations $$0.6 \leq \sigma/r \leq 0.7$$

$$0.1 \leq W/r \leq 0.3$$

where, $\sigma$ is the radius of the center of said annular region, W is the width of the said annular region, and $\Gamma$ is the radius of the pupil.

9. A projection exposure apparatus according to claim 1, further comprising means for attenuating the illumination distribution of said annular region.

10. A projection exposure apparatus according to claim 1, wherein the illumination distribution of said effective source has intensity peaks which are substantially symmetrical around said optical axis, and wherein the transmittance of the region substantially conjugate with the illuminating region of said effective source is lower than the transmittance of the remaining regions on the pupil plane of said projection lens means.

11. A projection exposure apparatus according to claim 1, wherein said transmittance reducing means includes an optical filter provided with means for cooling thereof.

12. A projection exposure apparatus according to claim 1, wherein said transmittance reducing means includes an optical filter disposed in the pupil plane of said projection lens means so as to substantially cover the entire first region.

13. A projection exposure apparatus according to claim 1, further comprising means defining an iris for the projection exposure apparatus, wherein the shaping means shapes the diameter of the annular illumination distribution to be smaller than the diameter of the iris.

14. A pattern forming method comprising the steps of:

illuminating onto a mask the light from an effective source having a substantially annular illumination distribution around an optical axis;

forming the light having passed said mask into an image by use of a projection lens;

making the transmittance of a first region on the pupil plane of said projection lens lower than that of a second region on the pupil plane of said projection lens, said first region being inside of the outer periphery of an annular region substantially conjugate with said effective source having the annular illumination distribution, and said second region being outside of said outer periphery; and exposing a photo-resist film to said image to form a pattern thereon.

15. A pattern forming method according to claim 14, wherein said making step includes the step of providing an optical filter in the pupil plane of the projection lens so as to substantially cover the entire first region.

* * * * *